United States Patent [19]

Wilson et al.

[11] Patent Number: 4,762,576
[45] Date of Patent: Aug. 9, 1988

[54] CLOSE SPACE EPITAXY PROCESS

[75] Inventors: Herbert L. Wilson; William A. Guiterrez, both of Woodbridge, Va.

[73] Assignee: The United States of America as represented by the Secretary of the Army, Washington, D.C.

[21] Appl. No.: 426,475

[22] Filed: Sep. 29, 1982

[51] Int. Cl.$^4$ .......................................... H01L 21/203
[52] U.S. Cl. ..................................... 156/611; 427/252
[58] Field of Search ....................... 427/252; 156/611; 148/175

[56] References Cited

U.S. PATENT DOCUMENTS

| | | | |
|---|---|---|---|
| 3,462,323 | 8/1969 | Groves | 427/252 X |
| 3,494,743 | 2/1970 | Baughman et al. | 427/252 X |
| 3,984,267 | 10/1976 | Craford et al. | 427/252 X |
| 4,211,182 | 7/1980 | Rosnowski | 156/611 X |

Primary Examiner—Richard D. Lovering
Attorney, Agent, or Firm—Max L. Harwell; Milton W. Lee; Anthony T. Lane

[57] ABSTRACT

A process of high pressure close-space epitaxy in the semi-confined atmosphere of a reusable demountable ampule in a furnace growth chamber. The ampule has a substrate and source materials placed therein whereupon the ampule is then loaded in the pressure furnace and the furnace is sealed air tight. Alternate steps of high pressure gas scrubbing and evacuating the interior of the furnace growth chamber including the interior of the ampule through small vents are first used to purify the growth environment. The source materials are then epitaxially grown on the substrate at a high pressure within the ampule. The ampule may be repeatedly used without having to be destroyed after each growth.

10 Claims, 3 Drawing Sheets

CLOSE SPACE EPITAXY PROCESS

The invention described herein may be manufactured, used, and licensed by the U.S. Government for governmental purposes without the payment of any royalties thereon.

BACKGROUND OF THE INVENTION

1. The present invention is in the field of vapor phase epitaxial (VPE) growth of semiconductor layers on a semiconductor host substrate by a close-spaced technique in a demountable ampule while under super imposed pressure, and especially to the growth of highly volatile Group II–IV or Group III–V materials.

2. Description of the Prior Art.

Due to the relatively high vapor pressure of some elements, such as Hg, and the relationship of that fact to the techniques of forming HgCdTe, it has been found that the loss of Hg in the process has been a problem. Several methods of epitaxial growth of materials have been used. Investigations of the interdiffusion of HgTe and CdTe have led to the development of a close-spaced technique for the epitaxial growth of HgCdTe onto a CdTe substrate. The close-space technique of placing the growth source elements in close proximity to a substrate in an evacuated ampule and then sealing off the ampule under vacuum in preparation for the epitaxial growth. Each time a layer of the source material is deposited on the substrate, the ampule must be broken open and thrown away. If any subsequent layers need to be deposited on the substrate the substrate and source have to be placed in another evacuated and sealed ampule with the ampule later broken open to extract the substrate therefrom and thrown away. Obviously, this method is somewhat cumbersome, time consuming, and expensive. Teachings of this prior art method may be found in U.S. Pat. No. 3,472,685 or in an article entitled, "Growth and Properties of $Hg_{1-x}Cd_xTe$ Epitaxial Layers", by O. N. Tufte and E. L. Stelzer in *Journal of Applied Physics*, Vol. 40, numbers 11, October 1969.

Some of the limitations and disadvantages of prior art close-space technology areas follows. New ampules must be made for each epitaxial growth and later broken to remove the growth. An ampule must be prepared for each separate step of the process, such as degreasing or other purification and for cleaning. The ampules must be sealed at high temperatures, thus releasing ampule impurities into the epitaxy environment. There can be no control of the atmosphere within the ampule after it is sealed, such as in situ cleanup of the ampule constituents during the epitaxial growth. The sealed ampule technique is not amenable to in situ multilayer growths and has a limitation to high volume production.

The present inventive method of close-space VPE growth under a high pressure environment of selected inert and reducing gases in a reusable demountable ampule alleviates all of the above problems.

SUMMARY OF THE INVENTION

The present invention is comprised of a process which allows for reusing a demountable in which close-spaced epitaxy occurs within a semi-confined atmosphere inside a high pressure furnace. The close space epitaxy is also known as isothermal evaporation-condensation-diffusion method. The process is comprised of further purification of the growth source materials, the substrate, the interior of the furnace and vapor within the ampule by virtue of inert and reducing gases scrubbing action before, during, and after the epitaxial growth. The reusable demountable ampule, used in the process, has the feature that when it is form-fittedly sealed by a removable plug, a very small passage vent, which is either in the removable plug or elsewhere between the interior and exterior of the ampule, allows for pressure equilibrium between the interior and exterior of the ampule but still provides overpressures for the semi-confined environment within the ampule.

By using significantly high gas overpressures, but explained herein simply as high gas pressures, of as an example inert and reducing gases comprised of argon and hydrogen respectively, volatile elements of Hg, Cd, and Te are not only sufficiently restricted to the growth area within the ampule to form high quality epitaxial layers due in part to further purification by hydrogen scrubbing of the vapors, the surfaces of the growth source materials, and the layers forming on the substrate. With sufficient gas overpressures there is also a tendency to restrict the vapor growth cloud by high density collision therefore further confining growth source material flow to the close-space between the growth source materials and the substrate, i.e. there is homogenous growth through collision diversification of the vapor stream. By using the present method of close-spaced epitaxial growth under high pressure, consideration of the diffusion process allows for the use of lower furnace temperature in the epitaxial steps of the process. Not only is the lower temperature for epitaxial growth possible but the temperature uniformity of the growth process is possible due to the high thermal conductivity of the pressurized gases. The substrate and growth source materials may however be at different temperatures by changing one or both positions with regard to the furnace heater elements.

An improved method of semiconductor epitaxy is disclosed wherein high pressure inert and reducing reactive gases are combined to form the medium in which the close space epitaxy is achieved with demountable capability. With the use of this pressurized medium a reusable demountable, i.e. non-fused sealed type, ampule may be used in the close-space epitaxy process. With demountable capability of the ampule, which is preferably an end plug that is form-fittedly sealed during the heated up time, the reusable ampule provides for higher purity process and more practical high volume epitaxy production. The inventive method will become better understood with reference to the following drawings and the detailed description.

DETAILED DESCRIPTION OF THE EMBODIMENTS

Figure 1:
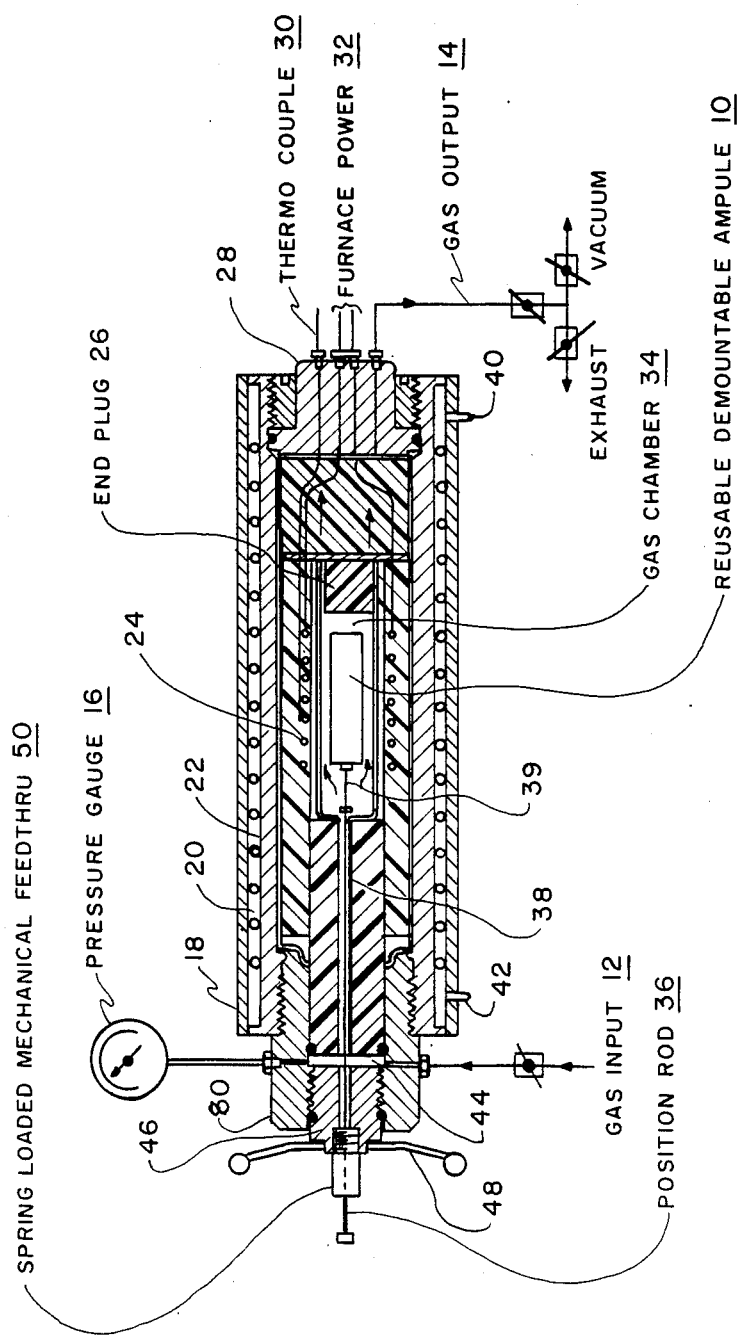
FIG. 1 illustrates a cross-sectional view of a furnace environment in which the present method may be practiced.
Figure 2:
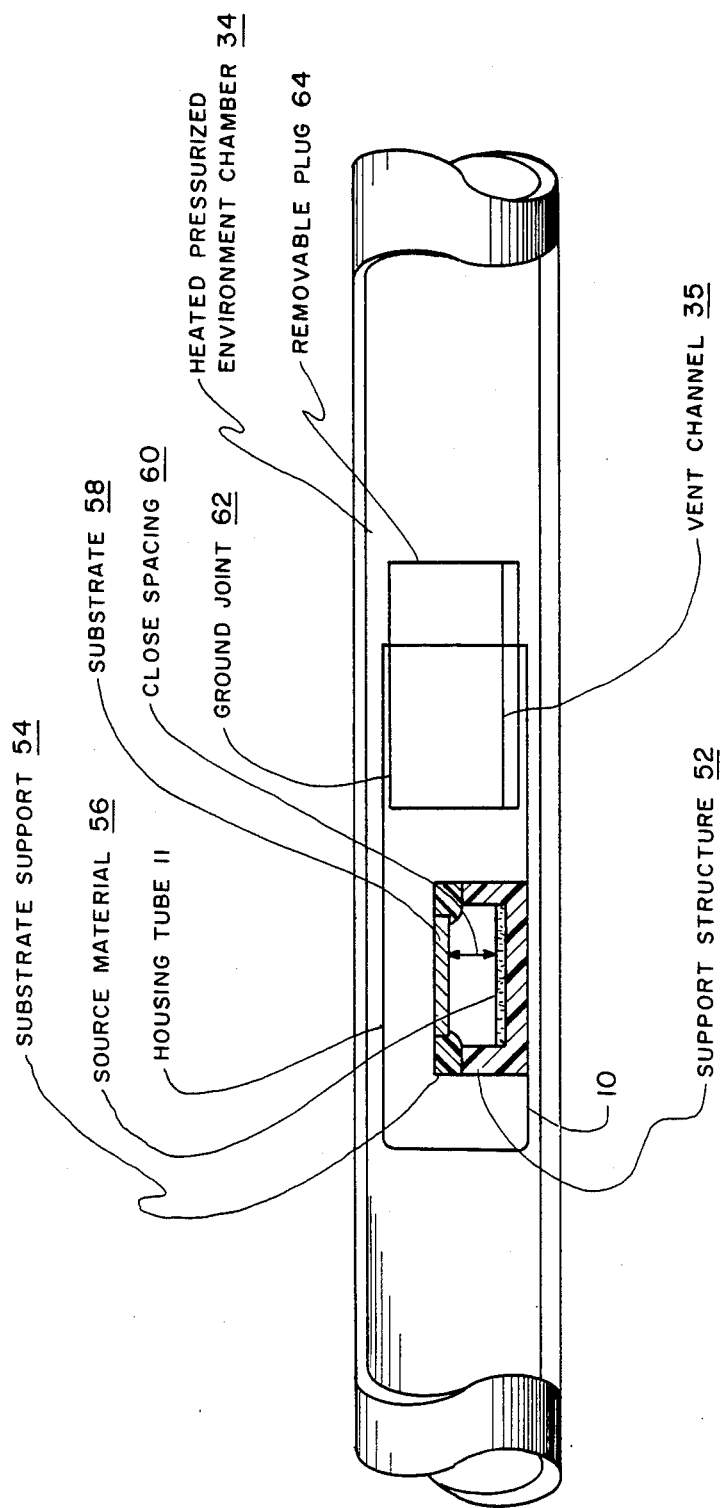
FIG. 2 is a sectional view of a single source ampule employed by the present method.
Figure 3:
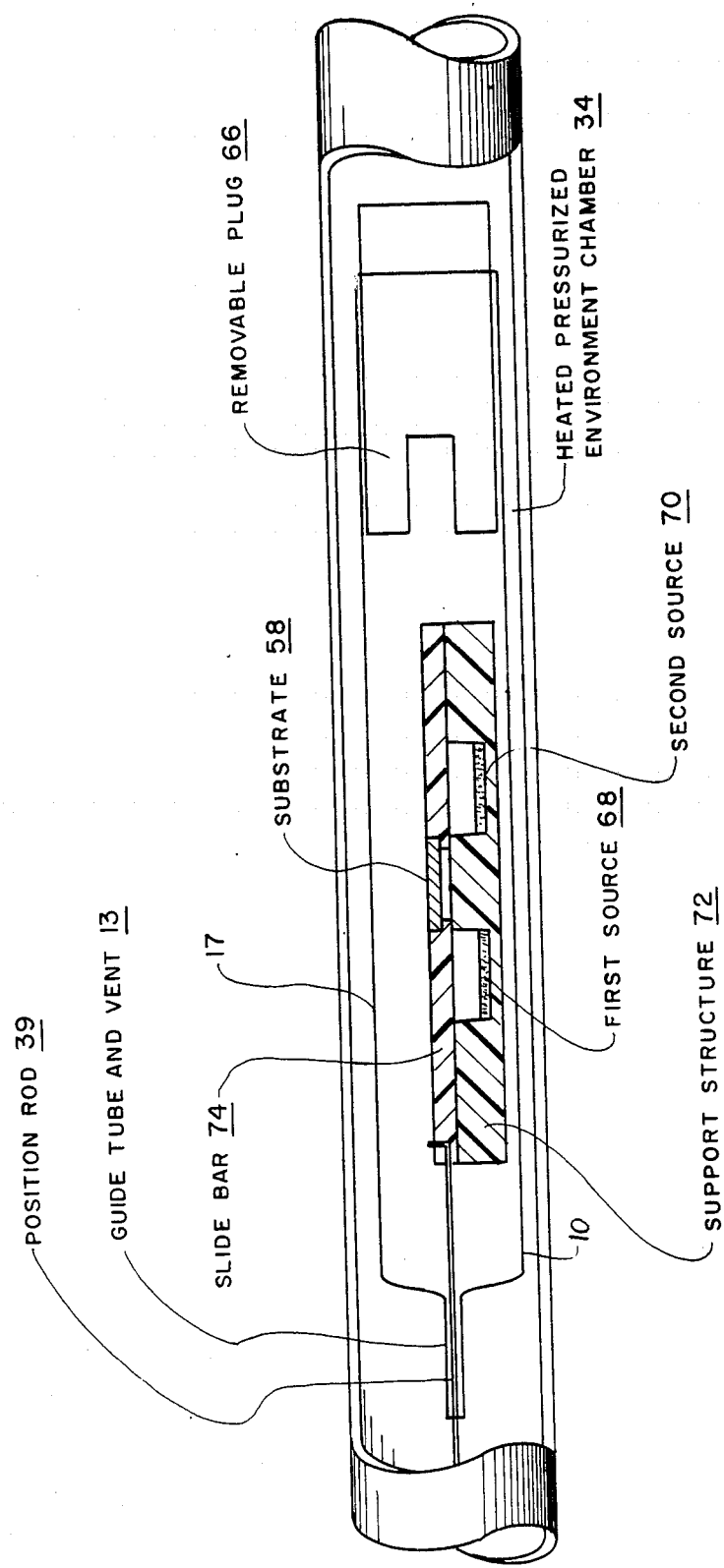
FIG. 3 is a sectional view of a multiple source ampule employed in the present method.

Refer to FIG. 1 which illustrates a pressure furnace environment in which the method of producing epitaxially grown substrates by the pressurized close-spaced technique may be practiced under super imposed pressure. The reusable demountable ampule 10, which is one of the salient features of this invention, is not shown in detail in FIG. 1 but is illustrated in its working environment in gas chamber 34. FIGS. 2 and 3 however show respectively a single source ampule and a multiple source ampule, both designate by numeral 10. The ampule of FIG. 1 is illustrated as a multiple source ampule, such as illustrated in FIG. 3, having the position rod 39 feeding through the guide tube 13 which also functions as a pressure equalization vent means for the ampule.

The pressure furnace environment and the operation of the reusable demountable ampule 10 used in the process will be better understood by referring to FIG. 1, which shows the furnace closed and in the normally operating mode with a gas mixture at input 12 flowing into gas input volume 44 which has a pressure gauge 16 in communication therewith and on through tubing 38 into the heated pressurized environment chamber 34. The flow of the gas mixture is shown by arrows, and eventually works its way out of chamber 34 by way of a vent means between end plug 26 and the chamber 34 wall and slowly filters through the loosely fitted insulation, which may be foam silica, to a gas output 14 running through a head closure 28 and exiting into a vacuum or exhaust. Also running through head closure 28 are furnace power connections 32 from a power source (not shown) to the furnace heater elements 24 and a thermocouple lead 30 leading to the vicinity of at least one of the heater elements 24 to monitor the temperature of the furnace. The furnace depicted is an internally heated furnace comprised of an outer metal safety jacket 18, a water baffle 20 having water flow therethrough from entrance and exit water valves 40 and 42, a metallic chamber wall 22 preferably made of steel, a layer of insulation within which the heater element 24 are embedded. An end cap 46 having handles 48 is screw threadably connected to a furnace closure 80, which is further screw threadably connected to chamber wall 22. A spring loaded mechanical feed through 50 is shown screw threadably attached to end cap 46. Feedthrough 50 has a metal position rod 36 which extends from the exterior of the furnace through end cap 46, volume 44, and the tubing 38 to attach to position rod 39 inside chamber 34. Position rod 39 is preferably made of quartz since it is within the heated chamber 34 and has a lower coefficient of thermal expansion than metal. Tubing 38 is also preferably made of quartz. The attachment between metal rod 36 and quartz rod 39 may be made in many ways. A male-female twist lock connection however is a very convenient means of attachment and disattachment The furnace may be loaded and unloaded with the reusable demountable ampule 10 as follows. Looking again specifically at FIG. 1, the ampule 10 may be removed from the furnace after the temperature is reduced to ambient and the pressure is released to one atmosphere as an operator may observe on pressure gauge 16. Removal begins by first disattaching rod 36 from rod 39. End cap 46 is then screw threadably removed along with rod 36. The epitaxial arrangement, which is comprised of the insulating layer having tubing 38 built therein and the gas chamber 34 walls attached thereto with the ampule 10 and end plug 26 within 34, is slipped out through stationary closure 80. To remove ampule 10 from chamber 34, end plug 26 is first removed. The ampule 10 is then slipped out of chamber 34. Loading the furnace with this epitaxial arrangement is simply the reversal of removal of the elements.

The ampule 10 is loaded by first removing a removable plug and then appropriately loading the growth source elements and substrate therein and reinserting the removable plug. Referring to FIG. 2, the single source ampule is shown already loaded, and inside a cutaway of the chamber 34. The ampule 10, chamber 34 walls, and removable plug 64 are preferably made of a high purity material with a high chemical inertness to the materials and vapors involved in the epitaxial growth, such as quartz. Plug 64 has at least one very small groove, forming vent channel 35, running its length. Vent means 35 functions to equalize the pressure of the chamber 34 and the interior of ampule 10 and provide a semi-confinement space inside ampule 10. Growth source elements 56 are loaded in a well within support structure 52. A substrate 58 is supported by substrate support 54 in a close-spacing proximity 60 to source elements 56. Structure 52 and support 54 are also preferably made of quartz. Support 54 rides lightly on structure 52 where the high pressure gases can pass there between and into the close-space between 56 and 58. The growth source elements 56 and substrate 58 may be many types of semiconductor materials but are generally anticipated as being Group II-VI materials, such as HgTe or $Hg_{1-x}Cd_xTe$ source materials 56 and CdTe substrates 58, or Group III-V materials, such as GaAs, InSbInP, GaAlAs, InAsGaP as either sources or substrates. The parameters explained herein will however be for HgTe as the source materials and CdTe as the substrate.

After loading the source elements 56 and substrate 58 into ampule 10, plug 64 is inserted into the ground joint 62 between 64 and housing tubee 11. Chamber 34 end plug 26 is then inserted in the end of the chamber 34 and then this portion, which is also attached to the insulation surrounding tubing 38 is inserted back into the furnace. It should be noted that with the single source process the spring loaded mechanical feedthrough 50 is removed from end cap 46 and a substitute air tight end cap (not shown) is screw threadably connected to end cap 46.

The multiple source elements ampule 10 as shown by FIG. 3 has been referenced herein above as being the embodiment as shown in FIG. 1 and is comprised of the use of quartz position rod 39 attached to metal position rod 36. The multiple source ampule 10 of FIG. 3 is comprised of housing tube 17 and removable end plug 66, both preferably made of quartz, and is shown loaded with first and second growth source elements 68 and 70, representative of a plurality of sources, which are respectively in two wells of support structure 72 with a substrate 58 supported by a slide bar 74. Structure 72 and bar 74 are preferably made of quartz. Slide bar 74 has the quartz position rod 39 attached thereto to facilitate movement thereof. Rod 39 passes through guide tube 13 loosely to provide a vent means for the inert and reducing reactive gases to enter the interior of housing 17. Slide bar 74 is riding on a groove vent means between bar 74 and support structure 72. Removable plug 66 has an opening therein for bar 74 to extend into. It is anticipated that in some other embodiments structure 72 may be moveable to move the source materials and the substrate remain stationary. The substrate 58 and sources 68 and 70 would however remain in the close-spaced epitaxial growth environment, with a typical spacing of about 5 millimeters.

The embodiments of FIG. 2 and 3 each have their advantages. As one illustration the single source may still provide multilayering on the substrate 58. Multilayering may be provided by either introducing different reactive gases before, during, or after the epitaxial growth to provide in situ formation of multilayers, passivation, and device structure. Some of the gases used may be hydrogen selenide, diethyl telluride, dimethyl cadmium, dimethyl mercury, other organic metallics, hydrides, silane, germane, etc. Dopants may also be introduced this way. These gases could serve to modify the electrical and optical properties of the epitaxially grown layers.

The embodiment as shown by FIGS. 1 and 3 uses an arrangement where the substrate 58, which is shown in the shutter position, may be physically moved over the selected sources 68 and 70 or other sources (not shown). When these separate sources, which contain different alloy compositions, are exposed to substrate 58 during selected periods of time during the process these sources will provide different epitaxial growths having differing electro-optic characteristics. For example, the substrate 58 can be in the shuttered position until the furnace chamber is heated up to a desired growth temperature and then the substrate 58 positioned over source 68 for the first layer growth and over source 70 for the second layer growth then back to the shuttered position for cool down. Multi-source arrangements may also be provided with the added technique as mentioned above with respect to the single source wherein different reactive gases may be used during the process to provide even better variations of the electrical and optical properties of the layers.

It should be noted that the above explained method of producing epitaxially grown layers on semiconductor substrated under reactive gas pressures employing loading the growth elements in a reusable demountable ampule having vent means to provide semiconfinement of the epitaxial process provides control of a more desirable x value profile in the epitaxial layer thickness. The present pressurized process allows for epitaxial growths at a lower temperature than was previously possible.

One example of how an epitaxially grown 20 micron thick $Hg_{0.8}Cd_{0.2}Te$ layer on a CdTe substrate may be produced is by using a HgTe source and a CdTe substrate with a close-spacing of 5 millimeters, an isothermal temperature of 500° C. for 4 hours, and under a hydrogen gas pressure of 100 atmospheres, i.e. about 1450 psi.

While our invention has been illustrated and described by means of specific embodiments, it is to be understood that changes and modifications may be made therein without departing from the spirit and scope of the invention as defined in the appended claims.

I claim:

1. A method of epitaxial growth in an externally controllable pressure and gaseous environment under super imposed pressure, said method comprised of the steps of:
   selecting a suitable heating pressurizing furnace having required temperature and pressure capability with air tight sealable means and gas mixture flow pressure controllable means therethrough;
   providing a reusable demountable, non-fused seal type ampule having a formfitted removable end plug and vent means between the interior which defines a semi-confinement space when said end plug is inserted in said ampule and the exterior;
   loading growth source materials and a substrate inside said ampule in close-spaced proximity to each other and inserting said end plug to provide said semi-confinement space;
   placing the loaded ampule in a heatable pressurizable innerchamber of said furnace;
   sealing and purging said innerchamber with alternating vaccum pressurization and pressure release cycles of high purity, high pressure inert and reducing gases to cleanse the insides of said innerchamber and said ampule through said vent means;
   epitaxially growing said growth source materials on said substrate under continuing high pressure flowing conditions of the inert and reducing gases within said furnace innerchamber and said semi-confinement space of said ampule by close-spaced vapor phase epitaxial growth within said semi-confinement space wherein said growth source materials are heated under pressurization of said inert and reducing gases, and deposition of said growth source materials on said substrate is caused by elevating the temperature of said furnace innerchamber in which pressurization of said inert and reducing gases purifies and restricts the vapor growth cloud by high density collision of said inert and reducing gases with the vaporized growth source materials and confines growth source material flow primarily to the close-spaced area between said growth source materials and said substrate within said semi-confinement space in said ampule; and
   cooling said furnace innerchamber down to ambient temperature while relieving the pressure of the circulating inert and reducing gases to one atmosphere and removing said ampule and the substrate and the remaining growth source materials therein wherein said ampule may be reused through repeated epitaxial growth steps.

2. A method as set forth in claim 1 wherein said step of providing a reusable demountable ampule is providing a clean and chemically inert ampule to the epitaxy process.

3. A method as set forth in claim 2 wherein said step of loading growth source materials and a substrate is comprised of loading Group II-VI materials or alloys as growth source materials as a substrate.

4. A method as set forth in claim 3 wherein said growth source materials are HgTe and said substrate is CdTe.

5. A method as set forth in claim 4 wherein said step of loading growth source materials and a substrate in said ampule is comprised of loading growth source materials in a support structure and placing a substrate on a substrate support so that source materials and substrate are spaced about 5 millimeters from each other and loading said support structure and said substrate support into said ampule and replacing said end plug.

6. A method as set forth in claim 4 wherein said step of loading growth source materials and a substrate inside said ampule is comprised of loading a plurality of different growth source materials in a plurality of wells of a support structure and placing said substrate on a slide bar which rides over said support structure and loading said support structure and said slide bar into said ampule and replacing said end plug wherein a positioning rod loosely passes through a guide tube on the end of the ampule opposite said end plug to provide a guide and said vent means and is attached between said slide bar and a spring loaded mechanical feedthrough on the exterior of said furnace to selectively position said substrate about 5 millimeters over said growth source materials.

7. A method as set forth in claims 5 or 6 wherein the step of epitaxially growing with high pressure reactive gases is comprised of introducing different reactive gases before, during, and after each epitaxial growth to provide epitaxial growth layers of differing electro-optic characteristics.

8. A method as set forth in claim 7 wherein said reactive gases are used in conjunction with hydrogen reducing gas and argon inert gas.

9. A method as set forth in claim 7 wherein said reactive gases are comprised of reactive gases from the group of hydrides and organo-metallics.

10. A method as set forth in claim 1 wherein said step of loading growth source materials and a substrate is comprised of loading Group III-V materials or alloys as growth source materials and as a substrate.

* * * * *